US006535886B1

(12) United States Patent
Koontz

(10) Patent No.: US 6,535,886 B1
(45) Date of Patent: Mar. 18, 2003

(54) METHOD TO COMPRESS LINGUISTIC STRUCTURES

(75) Inventor: Eugene Koontz, San Jose, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/420,515

(22) Filed: Oct. 18, 1999

(51) Int. Cl.[7] .............................................. G06F 17/30
(52) U.S. Cl. ............................... 707/102; 707/6; 704/9
(58) Field of Search ........................ 707/102, 6; 704/9

(56) References Cited

U.S. PATENT DOCUMENTS

| | | | |
|---|---|---|---|
| 4,814,746 A | * 3/1989 | Miller et al. .................. 341/95 |
| 4,905,138 A | * 2/1990 | Bourne ........................ 709/313 |
| 4,974,191 A | 11/1990 | Amirghodsi et al. ........ 364/900 |
| 5,010,345 A | * 4/1991 | Nagy .......................... 341/106 |
| 5,033,087 A | 7/1991 | Bahl et al. |
| 5,058,137 A | * 10/1991 | Shah .......................... 341/51 |
| 5,068,789 A | * 11/1991 | van Vliembergen ........... 704/9 |
| 5,083,268 A | 1/1992 | Hemphill et al. |
| 5,088,038 A | 2/1992 | Tanaka et al. ............... 364/419 |
| 5,095,432 A | 3/1992 | Reed |
| 5,111,398 A | * 5/1992 | Nunberg et al. ............... 704/6 |
| 5,155,484 A | * 10/1992 | Chambers, IV ............. 341/106 |
| 5,323,155 A | * 6/1994 | Iyer et al. .................... 341/51 |
| 5,418,717 A | 5/1995 | Su et al. ................ 364/419.08 |
| 5,426,583 A | 6/1995 | Uribe-Echebarria Diaz De Mendibil .......... 364/419.08 |
| 5,485,373 A | * 1/1996 | Davis et al. ................ 707/531 |
| 5,510,981 A | 4/1996 | Berger et al. .......... 364/419.02 |

(List continued on next page.)

FOREIGN PATENT DOCUMENTS

EP 0805403 A2 11/1997

OTHER PUBLICATIONS

PCT Search Report, Feb. 22, 2001, 5 pages.
PCT Search Report, International Application No. PCT/US00/28777, Oct. 17, 2000.
PCT Search Report, International Application No. PCT/US00/28830, Oct. 18, 2000.
PCT Search Report, International application no. PCT/US00/41256, filed Oct. 17, 2000.
S. Kurohashi, T. Nakamura, Y. Matsumoto, M. Nagao. Improvements of Japanese Morphological Analyzer JUMAN. In: "Proceedings of the International Workshop on Sharable Natural Language Resources", p. 22–28, Nara, Japan, 1994.
Kenneth W. Church, "A Stochastic Parts Program and Noun Phrase Parser for Unrestricted Text", in Proceedings of the Second Applied Natural Language Processing Conference, Austin, TX, 1988.
Edited by Karen Jensen, George E. Heidorn, Stephen D. Richardson, "Natural Language Processing: The PLNLP Approach", Kluwer Academic Publishers, 1993, 22 pages.
Stuart M. Shieber, An Introduction to Unification–based Approaches to Grammar, CSLI, 1986, 23 pages.
M. Tomita, T. Mitamura, H. Musha, M. Kee, "The Generalized LR Parser/Compiler Version 8.1: User's Guide", CMU–CMT–88–MEMO, Apr. 20, 1988, 44 pages.

(List continued on next page.)

Primary Examiner—Wayne Amsbury
(74) Attorney, Agent, or Firm—Blakely, Sokoloff, Taylor & Zafman LLP

(57) ABSTRACT

A method and system for compressing a data structure. A segment is identified within the data structure. Each segment identified is counted for the number of occurrences of the segment within the data structure. If the number of occurrences is greater than one, the segment is saved in a recurring data structure. Also, the recurring segment within the data structure is replaced with an index to the segment stored in the recurring data structure.

28 Claims, 10 Drawing Sheets

U.S. PATENT DOCUMENTS

| | | | |
|---|---|---|---|
| 5,528,491 A | | 6/1996 | Kuno et al. ............. 364/419.08 |
| 5,535,120 A | | 7/1996 | Chong et al. .......... 364/419.03 |
| 5,561,421 A | * | 10/1996 | Smith et al. ................. 341/106 |
| 5,659,737 A | * | 8/1997 | Matsuda ...................... 341/90 |
| 5,659,765 A | | 8/1997 | Nii .............................. 395/754 |
| 5,677,835 A | | 10/1997 | Carbonell et al. ..... 364/419.02 |
| 5,680,511 A | * | 10/1997 | Baker et al. ................. 704/257 |
| 5,680,601 A | * | 10/1997 | Rust ............................ 341/50 |
| 5,754,847 A | * | 5/1998 | Kaplan et al. ................ 704/10 |
| 5,768,603 A | | 6/1998 | Brown et al. ............... 395/759 |
| 5,799,268 A | | 8/1998 | Boguraev ...................... 704/9 |
| 5,806,021 A | | 9/1998 | Chen et al. .................... 704/9 |
| 5,864,788 A | | 1/1999 | Kutsumi |
| 5,873,056 A | | 2/1999 | Liddy et al. ................... 704/9 |
| 5,907,821 A | | 5/1999 | Kaji et al. ...................... 704/4 |
| 5,951,623 A | * | 9/1999 | Reynar et al. .............. 341/106 |
| 5,963,894 A | | 10/1999 | Richardson et al. |
| 5,966,686 A | | 10/1999 | Heidorn et al. |
| 5,977,890 A | * | 11/1999 | Rigoutsos et al. ............ 341/55 |
| 5,983,169 A | | 11/1999 | Kozma .......................... 704/2 |
| 6,067,543 A | * | 5/2000 | Burrows ........................ 707/4 |
| 6,070,140 A | * | 5/2000 | Tran ........................... 264/239 |
| 6,092,065 A | * | 7/2000 | Floratos et al. ............. 382/161 |
| 6,100,825 A | * | 8/2000 | Sedluk et al. ................. 341/51 |
| 6,121,901 A | * | 9/2000 | Welch et al. .................. 341/51 |
| 6,131,082 A | * | 10/2000 | Hargrave et al. .............. 704/7 |
| 6,161,083 A | | 12/2000 | Franz et al. .................... 704/4 |
| 6,173,441 B1 | | 1/2001 | Klein |
| 6,212,500 B1 | | 4/2001 | Kohler |
| 6,230,153 B1 | | 5/2001 | Howard et al. |
| 6,230,168 B1 | * | 5/2001 | Unger et al. ............. 707/501.1 |
| 6,240,409 B1 | * | 5/2001 | Aiken ........................ 707/101 |
| 6,243,669 B1 | | 6/2001 | Horiguchi et al. |
| 6,285,978 B1 | * | 9/2001 | Bernth et al. ................... 704/2 |
| 6,330,530 B1 | * | 12/2001 | Horiguchi et al. .......... 704/277 |

OTHER PUBLICATIONS

M. Tomita, K. Knight, "Pseudo–Unification and Full–Unification", CMU, 1987, 10 pages.

M. Ishii, K. Ohta, H. Saito, "An Efficient Parser Generator for Natural Language", COLING 1994, 3 pages.

O. Furuse, H. Iida, "An Example–Based Method for Transfer–Driven Machine Translation", Proceedings of the Conference on Theoretical and Methodological Issues in Machine Translation (TMI–92), 1992, p. 139–150.

P. Resnik, "Using Information Content to Evaluate Semantic Similarity in a Taxonomy", Proceedings of the International Joint Conference on Artificial Intelligence (IJCAI–95), 1995.

T.C. Bell, J.G. Cleary, I. H. Witten, "Text Compression", Prentice Hall, 1990, 19 pages.

H. Maruyama, H. Watanabe, "Tree Cover Search Algorithm for Example–Based Translation", in Proceedings of the Fourth International Conference on Theoretical and Methodological Issues in Machine Translation (TMI–92), 1992, p. 173–184.

* cited by examiner

Uncompressed Feature Structure      810

(PHRASE   ((NP  ((ADJ((CAT ADJ)
                     (ADJ-TO-ADJ +)                812
                     (LEX-TYPE GEN)
                            (HEAD ((ROOT "abdominal")
                                   (THES X)))
                                  (TYPE BASE-ADJP)))
                (CAT NOUN)
                (LEX TYPE EXT)                     814
                (HEAD ((ROOT "Pain")
                       (THES (*MULTIPLE* PAIN SYMPT-NAM))))
                (TYPE SIMPLE-NP)))
           (TYPE NOMINAL-PRED)))

FIG. 8

Compressed Feature Structure       910

(PHRASE   ((NP  ((ADJ((CAT ADJ)
                     (ADJ-TO-ADJ +)
                     (LEX-TYPE GEN)
                            (HEAD ((ROOT "abdominal")
                                   (THES X)))
                                  (TYPE BASE-ADJP)))
                (CAT NOUN)                         912
                (LEX TYPE EXT)
                (HEAD (COMPRESSED 8391.90)))
                (TYPE SIMPLE-NP)))
           (TYPE NOMINAL-PRED)))

FIG. 9

METHOD TO COMPRESS LINGUISTIC STRUCTURES

FIELD OF THE INVENTION

The present invention is related to data structure compression. More specifically, the present invention relates to the compression of linguistic data structures for natural language translation systems.

BACKGROUND OF THE INVENTION

Natural language translation systems process and manage thousands of words, phrases, and sentences. To process and manage such vast amounts of data, linguistic data structures are used. These linguistic data structures not only store words, phrases, and sentences, but may also store associated qualifiers in order to process and manage the data more efficiently. Consequently, the large number and large size of linguistic data structures require large amounts of memory. Thus, a goal of natural language translation systems is to reduce the amount of memory for storing the linguistic data structures during language translation.

Conventional data compression techniques, however, are not well suited for compressing linguistic data structures for natural language translation systems. For example, a common data compression technique is the Lempel-Ziv (LZ) method. The LZ method exchanges recurring substrings automatically in straight text with references to the substrings according to a longest-match algorithm. Although the LZ method provides a comparatively high compression ratio, the LZ method is not well suited for natural language translation systems because natural language translation systems require fast and random access to any compressed text to perform language translation. In order for the LZ method to access the compressed text rapidly and randomly, the text must be entirely decompressed, which results in a performance penalty. Because natural language translation systems require fast and random memory access, it is not suitable to use the LZ method for compressing linguistic data structures.

Another conventional data compression technique is the dictionary method. The dictionary method references and stores redundant tokens in a separate dictionary. The tokens are chosen by human interaction. In this technique, the data may then be compressed by exchanging each instance of the token with a reference to the dictionary. The dictionary method requires human interaction in determining which substrings are to be referenced with tokens. For natural language translation systems, requiring human interaction is not feasible for compressing linguistic data structures because of the large amounts of data involved. Thus, what is required is a method to compress recurring segments within a data structure with an index to the segment while allowing fast and random access to the data structure.

SUMMARY OF THE INVENTION

A method and system for reducing the amount of memory used while allowing fast and random access to linguistic structures are described. In one embodiment, at least one segment within a data structure is identified. Each identified segment is counted to determine a number of occurrences of the identified segment within the data structure. Also, if the number occurrences is greater than one, the segment is saved in a recurring data structure and the segment is replaced in the data structure with an index corresponding to the segment in the recurring data structure.

BRIEF DESCRIPTION OF THE DRAWINGS

The objects, features and advantages of the present invention will be apparent to one skilled in the art in light of the following detailed description in which:

FIGS. 2b, 2c, and 2d are exemplary diagrams of structures used by the natural language translation system of FIG. 2a;

FIG. 8 is an exemplary uncompressed linguistic data structure; and

FIG. 9 is an exemplary compressed linguistic data structure.

DETAILED DESCRIPTION

Figure 1:
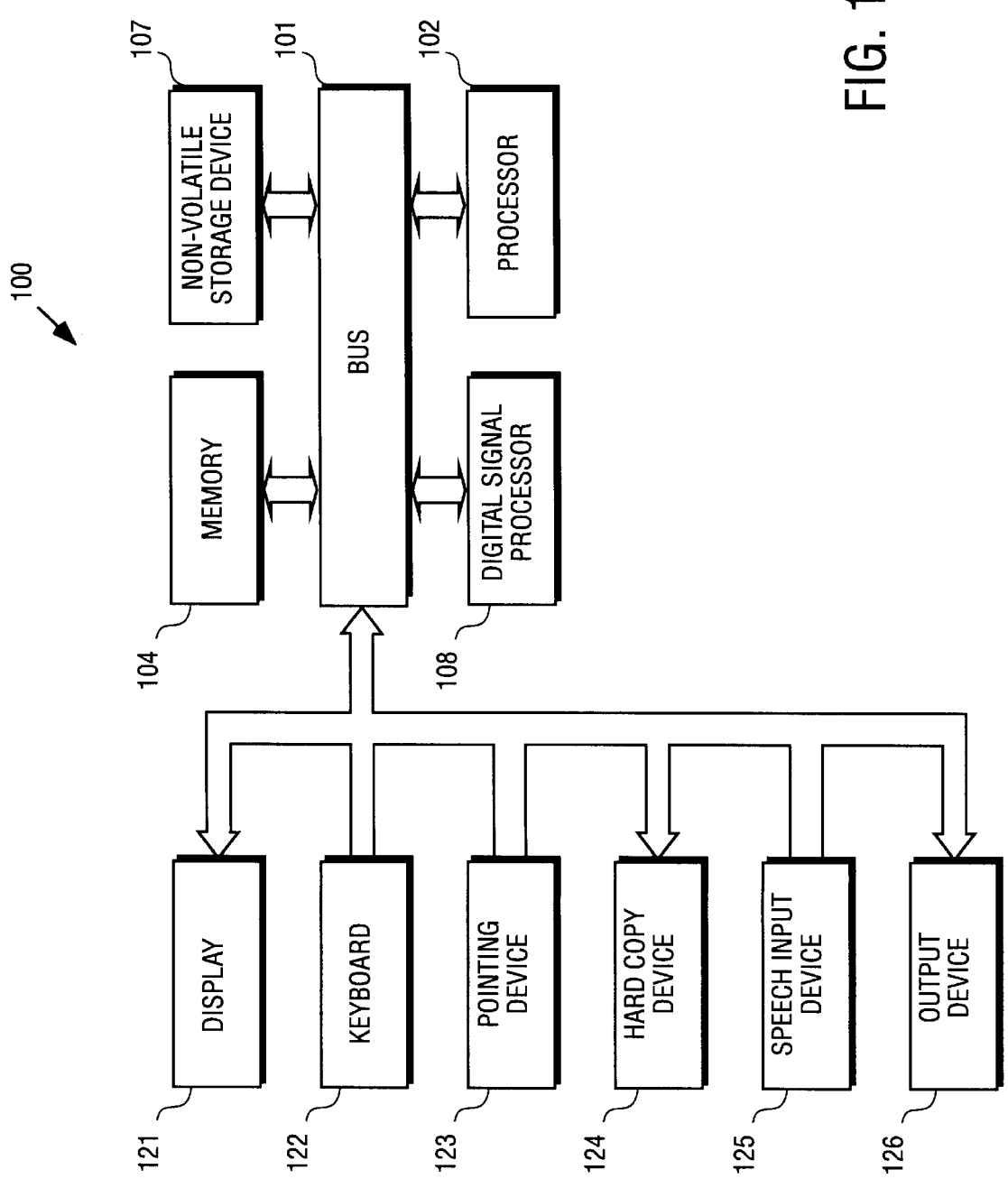
FIG. 1 is a block diagram of one embodiment for an architecture of a computer system.

In the following detailed description of embodiments of the invention, reference is made to the accompanying drawings in which like references indicate similar elements, and in which is shown by way of illustration specific embodiments in which the invention may be practiced. Numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical and other changes may be made without departing from the scope of the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "identifying" or "saving" or "replacing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method. For example, any of the methods according to the present invention can be implemented in hard-wired circuitry, by programming a general purpose processor or by any combination of hardware and software. One of skill in the art will immediately appreciate that the invention can be practiced with computer system configurations other than those described below, including hand-held devices, multiprocessor systems, microprocessor-based or programmable consumer electronics, network PCs, minicomputers, mainframe computers, and the like. The invention can also be practiced in distributed computing environments where tasks are performed by remote processing devices that are linked through a communications network. The required structure for a variety of these systems will appear from the description below.

The methods of the invention are described in terms of computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application . . . ), as taking an action or causing a result. Such expressions are merely a shorthand way of saying that execution of the software by a computer causes the processor of the computer to perform an action or a produce a result.

FIG. 1 is a block diagram of one embodiment for an architecture of a computer system 100. Referring to FIG. 1, computer system 100 includes system bus 101 that allows for communication among processor 102, digital signal processor 108, memory 104, and non-volatile storage device 107. System bus 101 may also receive inputs from keyboard 122, pointing device 123, and speech signal input device 125. System bus 101 provides outputs to display device 121, hard copy device 124, and output device 126 (such as, for example, an audio speaker). Memory 104 may include, for example, read only memory (ROM), random access memory (RAM), flash memory, or any combination of the above.

It will be appreciated that computer system 100 may be controlled by operating system software which includes a file management system, such as, for example, a disk operating system, which is part of the operating system software. The file management system may be stored in non-volatile storage device 107 and may be configured to cause processor 102 to execute the various functions required by the operating system to input and output data and to store data in memory 104 and on non-volatile storage device 107.

Figure 2A:
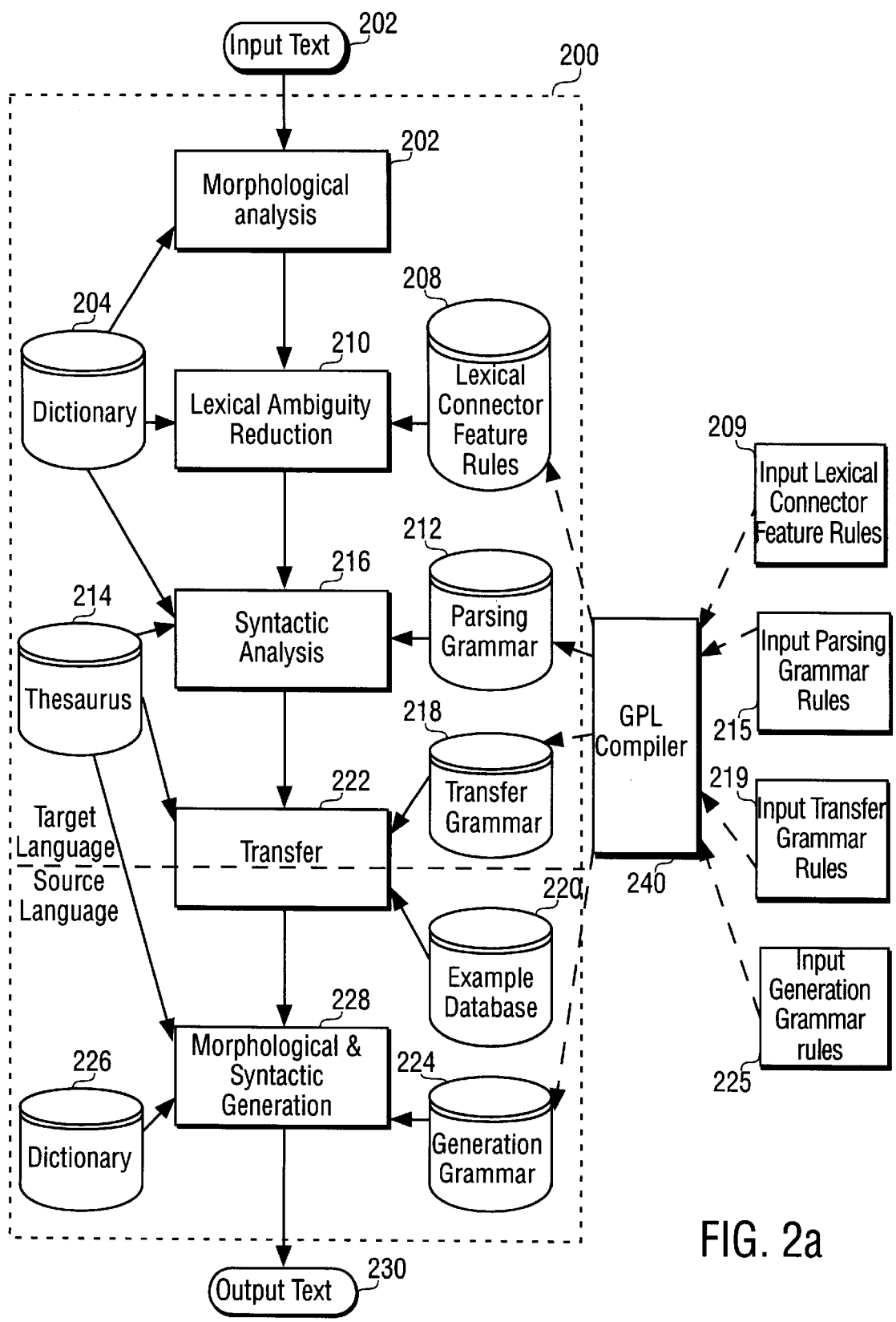
FIG. 2a is a block diagram of one embodiment for a natural language translation system.

In one embodiment, linguistic data structures may be compressed and used with a natural language translation system. FIG. 2a is a block diagram of one embodiment for a natural language translation system 200. Referring to FIG. 2a, natural language translation system 200 includes five modules, supporting databases, and associated grammars to quickly and accurately translate text between source and target languages. Input text may be directly input into natural language translation system 200 (for example, as with a person typing sentences into a computer using keyboard 122). Alternatively, input text to natural language translation system 200 may be the output of another system, such as, for example, output from a speech recognition system (for example, speech input device 125), or from an optical character recognition system (not shown).

An English sentence "He wants to go to the White House" is used throughout this section as example text input to describe the functioning of the system 200. The individual units in a sentence are referred to herein as "words" but the natural language translation system 200 is not limited to only word-based natural languages, having equal applicability to translation of character-based languages as well. Except where the differences in processing word-based and character-based languages are specified, the term "word" is intended to encompass both words and characters.

In the following description, a grammar is generally a set of context-free rules that define the valid phrase structures in the source or target language, with each context-free rule associated with one or more statements (the "rule body") that perform tests and manipulations on the linguistic representations (feature structures). Thus, an English sentence may be combined from a noun phase (NP) and a verb phrase (VP), but the subject and verb forms must agree, e.g., "He want to go to the White House" is a valid phrase structure but an improper English sentence. All rule bodies utilized by the grammars of language translation system 200 are in the form of computer-executable routines produced by defining the grammar in terms of a grammar programming language (GPL) and passing appropriate rule bodies (209, 215, 219, and 225) through a GPL compiler 240. The output of the GPL compiler 240 may be in the form of directly executable code, or may be in the form of standard computer programming language statements (such as, for example, C, C++, Pascal, or Lisp) which are then input into the corresponding programming language compiler to produce executable code. In either case, the compiled grammars include a specific function for each context-free rule. The specific function performs all the processing required by the rule and its associated rule body. Furthermore, the interfaces between the compiled grammars and the modules enable a single language translation system 200 to perform translation between multiple natural languages, and to perform more than one translation simultaneously.

A morphological analysis module 206 takes text input 202 and uses a source language dictionary 204 to decompose the words into morphemes by identifying root forms, grammatical categories, thesaurus information, and other lexical features of the words. The morphological analysis module 206 builds a "feature structure" for each word. Feature structures are well known in the art as linguistic data structures that contain feature-value pairs for strings, symbols, and numbers that appear in a natural language sentence. Each feature of a word is mapped to the appropriate value through a function commonly designated as:

word ↦ [feature: value]

Thus, a simplified, exemplary representation of the feature structures for the words "he" and "wants" are as follows:

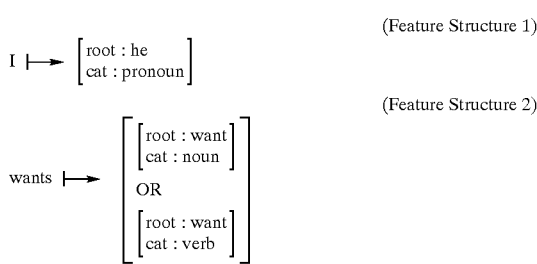

(Feature Structure 1)

(Feature Structure 2)

The Feature Structure 2 may be referred to as a "disjunctive" feature structure as it represents two mutually exclusive feature structures that are valid for the word.

It will be appreciated that the grammatical category is not the only feature of these two words and that morphological analysis module 206 outputs full feature structures. The example feature structures are simplified for the sake of clarity in explanation and are also frequently represented by a shorthand notation, e.g., [want] or NP[ ].

The feature structures built by morphological analysis module 206 are input into lexical ambiguity reduction module 210. In one embodiment, lexical ambiguity reduction module 210 may segment the words in character-based languages that do not utilize spaces through a database of lexical connector feature rules 208. Lexical connector feature rules 208 are created from GPL grammar statements as described above. Each possible combination of adjacent segmented words are assigned a lexical cost. Dictionary 204 defines combinations of words ("multiwords"). Lexical ambiguity reduction module 210 evaluates each feature structures that contains a part-of-speech (POS) ambiguity, such as the feature structure for the word "wants" which is tagged as both a noun and a verb. The various possible POS tags are assigned a lexical cost. Lexical ambiguity reduction module 210 weighs the cost assigned to each word in the sentence and selects those feature structures that have the lowest cost.

Figure 2B:
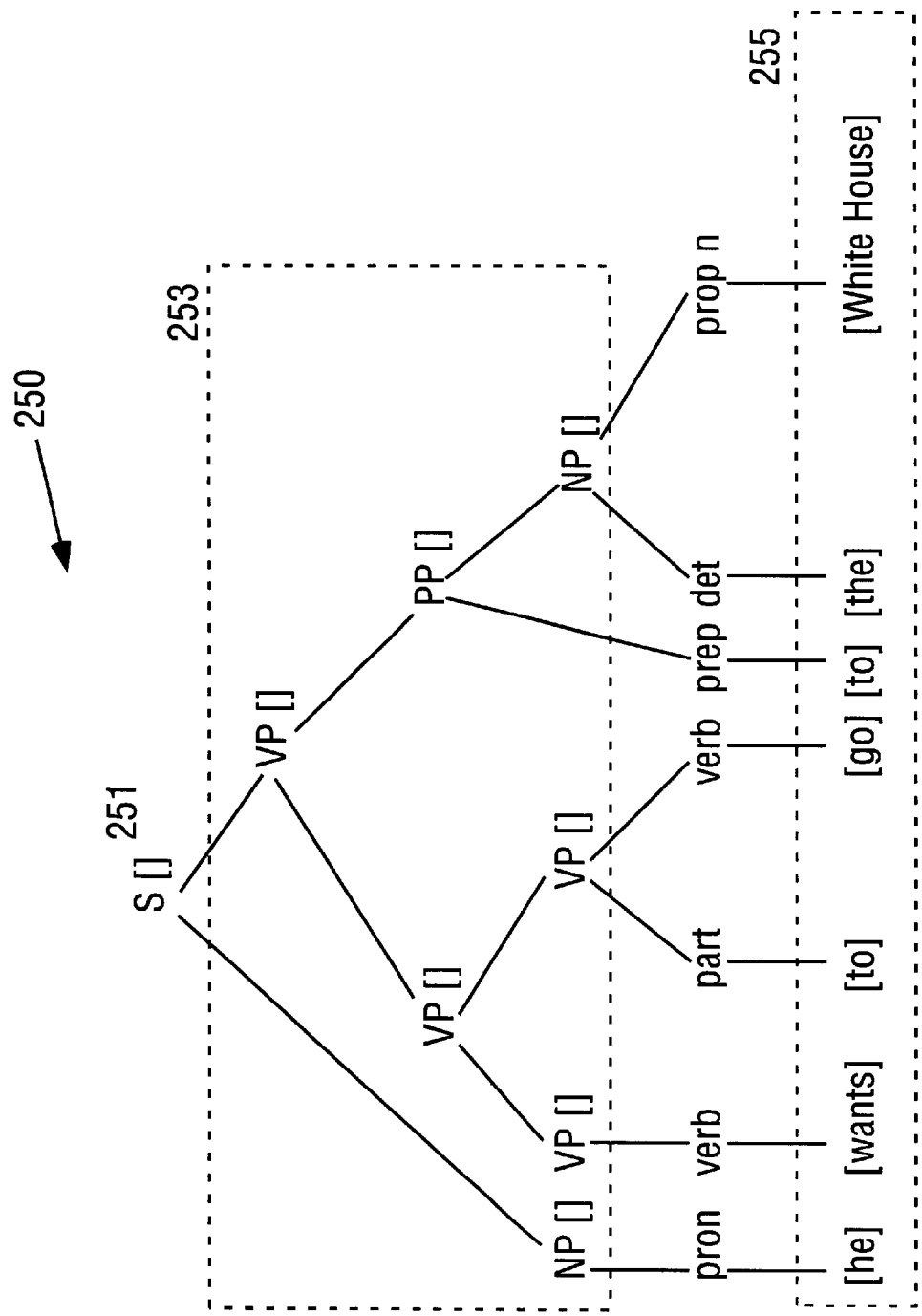

The feature structures chosen for the words by lexical ambiguity reduction module 210 are passed to syntactic analysis module 216. Syntactic analysis module 216 combines the chosen feature structures into a feature structure that represents the content of the input sentence. In one embodiment, syntactic analysis module 216 uses parsing grammar 212 to create a syntax parse tree for the sentence. Parsing grammar 212 contains the source language context-free grammar rules in the form of a parsing table and the associated rule bodies in executable code. Each leaf of the syntax parse tree is a feature structure for one of the words in the sentence. Once the leaves are created, an intermediate feature structure for each branch (parent) node in the syntax parse tree is built by combining its child nodes as specified in one or more of the context-free grammar rules. The rule body for each potentially applicable context-free grammar rule manipulates the various feature structures at the child nodes and determines whether the associated context-free rule could create a valid phrase from the possible combinations. A rule body may cause a thesaurus 214 to be queried as part of the manipulation. It will be appreciated that the feature structure that results from applying the context-free grammar rules may be nested (i.e., contain multiple feature structures from each child node). Syntactic analysis module 216 may create the syntax parse tree shown in FIG. 2b for the example sentence from its constituent feature structures, with the following feature structure at the top (root) of the syntax parse tree to represent the full sentence:

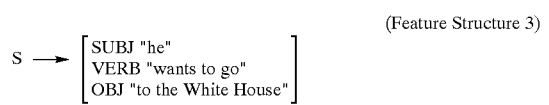

(Feature Structure 3)

It will be appreciated that both the syntax parse tree 250 and the Feature Structure 3 are not exact representations but are simplified for purposes of ease in explanation.

The feature structure for the sentence in the source language is passed to transfer module 222. The feature structure represents the analysis of the source input and may contain a number of nested linguistic representations (referred wherein as sub-structures or slots). Transfer module 222 uses transfer grammar 218 to match source language slots of the input with source language slots in example database 220. Example database 220 contains feature structure pairs in the source language and a target language. For example, database 220 may contain matching feature structures in English and Japanese. Transfer grammar 218 consists of a set of rewrite rules with a context-free component and a GPL rule body. The context-free parts of the rules are used to create a transfer generation tree.

Figure 2C:
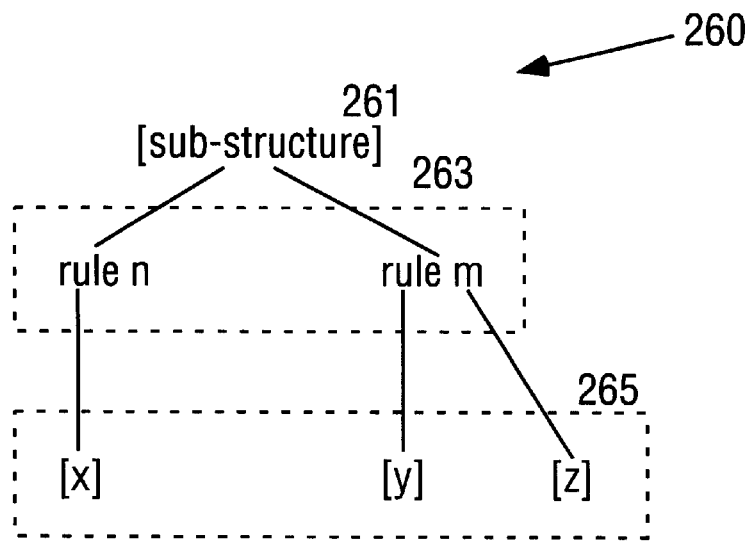

Transfer module 222 uses the GPL rule bodies within transfer grammar 218 to match the input source sub-structures or slots to the source sub-structures or slots in example database 220. If a good match is found (in one embodiment, a low overall match cost), transfer module 222 checks if all sub-structures or slots of the input feature structure have found a match. If a match for a sub-structure is not found, the sub-structure is used as input to transfer module 222. A transfer generation tree of the form shown in FIG. 2c is used to break the sub-structure into multiple sub-structures. The new input may be a art of the original, source feature structure or a new feature sub-structure that is constructed from sections of different slots.

Transfer module 222 uses the input feature structure (or sub-structure) in the source language as the starting symbol to build transfer generation tree 260. Root 261 is a symbol-node (s-node) and is labeled with the starting symbol of the feature structure. The transfer grammar determines which transfer grammar rules are applicable to the feature structure at the root 261, and creates child rule-node(s) (r-node) 263 depending from root 261. In one embodiment, r-nodes 263 are the rule numbers within transfer grammar 218 that may be validly applied to the input feature structure. Transfer grammar 218 rules added to tree 260 are applied to the s-nodes 265. If the application of each rule succeeds, a child rule-node (r-node) 265 is added to tree 260. If the application fails, the s-node 261 is tagged as "dead" for sub-sequent removal. Transfer grammar 218 then creates a new s-node 265 for each r-node 263. Again, the applicable rules are found for each s-node 265 and applied. The process is repeated until all sub-features within the feature structure have been expanded. Transfer generation tree 260 is then pruned to remove any "dead" nodes and corresponding sub-trees. If root 261 is tagged as "dead," the generation fails. Otherwise, the resulting transfer generation tree 260 is used by transfer module 222 to match the feature structure against the example database 220. The feature structures and sub-structures in the target language associated with a match are substituted for the corresponding feature structures and sub-structures matched in the source language. Transfer module 222 recursively applies the transfer rules contained within transfer grammar 218 from the top-most transfer rules until all meaningful sub-features or constituents within the input source feature structure are transferred to the target sub-structures. The transfer module 222 will consult the thesaurus 214 when required to do so by a transfer rule. Transfer module 222 outputs a feature structure in the target language.

Figure 2D:
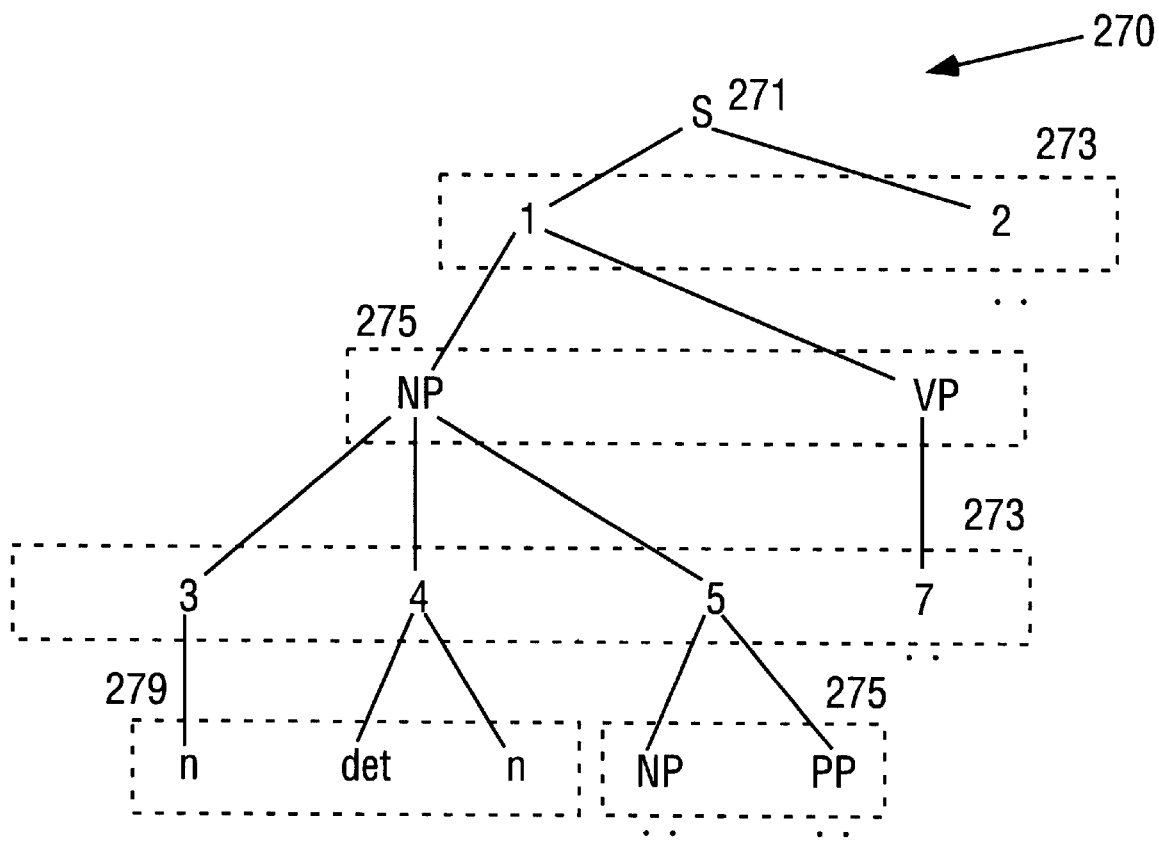

The feature structure for the sentence in the target language is passed to a morphological and syntactical generation module 228, where it is used as the root node for a syntactical generation tree, an example of which is shown in FIG. 2*d*. The syntactical generation tree is built in the same fashion as the transfer generation tree, with context-free rules in a generation grammar 224 as its r-nodes 273. The generation grammar 224 copies information to each s-node 275, 279. Unlike the transfer module 226, in which multiple sub-transfers created multiple transfer generation trees, only one syntactical generation tree is created by the morphological and syntactical generation module 228. Any s-node that is not a leaf node 279, i.e., associated with a feature structure for a word, is used to generate the next level of r-nodes. When all child s-nodes under an r-node are leaf nodes, the current branch of the tree is complete and the morphological and syntactical generation module 228 traverses back up the tree to find the next s-node that is not a leaf node. The thesaurus 214 is consulted when necessary during the generation of the tree. The transfer generation tree is complete when all the lowest level s-node are leaf nodes.

Figure 3:
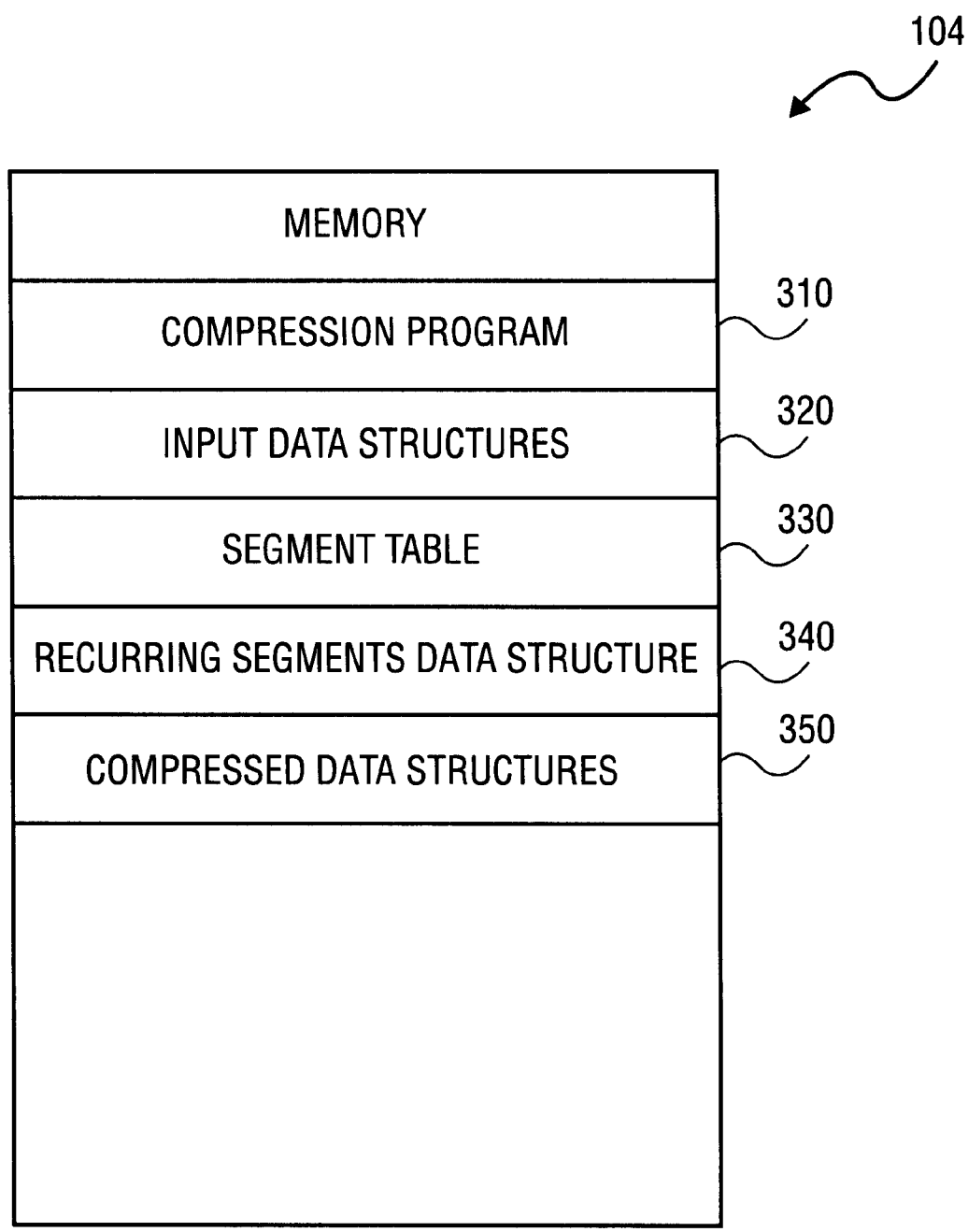
FIG. 3 is a block diagram of one embodiment for a memory, such as that shown in FIG. 1.

When the syntactical generation tree is complete, the leaf nodes contain output feature structures representing the words in one or more translations of the input sentence. The sequence of output feature structures that represents the best sentence is converted into output text 230 by the morphological and syntactical generation module 228 using the dictionary 226. Alternatively, all output feature structures for all sentences may be converted into the output text FIG. 3 is a block diagram of one embodiment for a memory 104. Referring to FIG. 3, memory 104 includes a compression program 310, input data structures 320, segment table 330, recurring segments data structure 340, and compressed data structures 350.

Compression program 310 includes program instructions written in a high level programming language such as C or C++ used to compress data structures. Input data structures 320 are used to store uncompressed data structures. In one embodiment, input data structures 320 contain a plurality of uncompressed linguistic data structures such as, for example, the uncompressed feature structure 800 shown in FIG. 8. Segment table 330 is used to store each identified segment within a data structure contained in the input data structures 320 and a count value associated with each segment that represents the number of occurrences of the identified segment within the data structure. Recurring segments data structure 340 is used to store segments that recur more than once in the data structure. Compressed data structures 350 are compressed linguistic data structures such as, for example, the compressed feature structure 900 shown in FIG. 9. In one embodiment, a single input data structure 320 and a single compressed data structure 350 are utilized.

Figure 4:
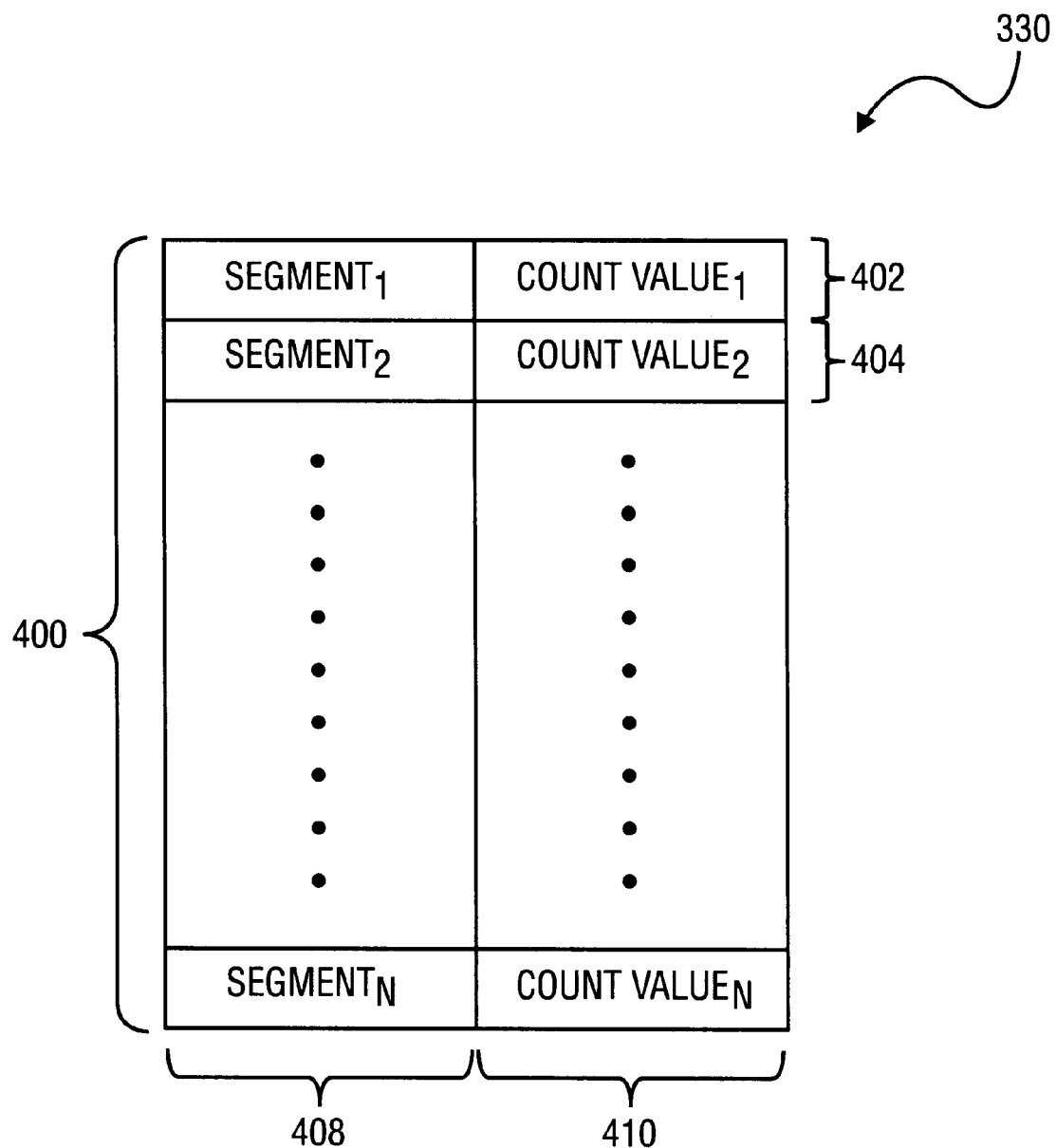
FIG. 4 is a block diagram of one embodiment for a table, such as that shown in FIG. 3.

FIG. 4 is a block diagram of one embodiment for segment table 330. Segment table 330 includes from 1 (402) to N (406) rows of segment entries 400. Each segment entry 400 contains from 1 to N segments 408 and from 1 to N count values 410. Each segment entry 400 represents an identified segment within input data structures 320 and the corresponding count value of the number of occurrences of the segment in input data structures 320.

Figure 5:
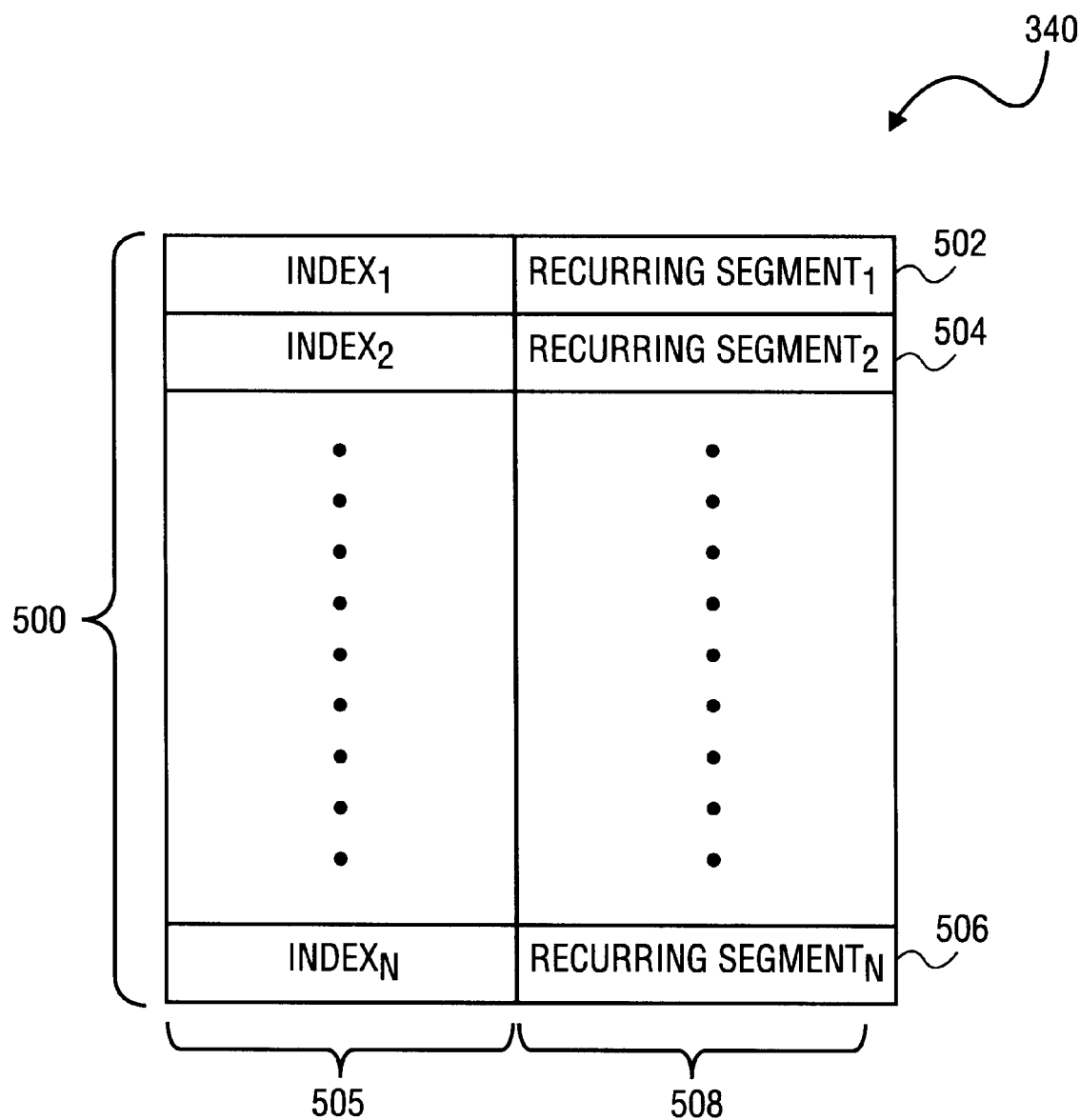
FIG. 5 is a block diagram of one embodiment for a recurring segments data structure, such as that shown in FIG. 3.

FIG. 5 is a block diagram of one embodiment for recurring segments data structure 340. Recurring segments data structure 340 includes from 1 (502) to N (506) rows of recurring segment entries 500. Each recurring segment entry 500 contains from 1 to N indices 505 and from 1 to N recurring segments 508. Each recurring segment entry 500 represents an index 505 corresponding to a specific recurring segment 508 found in input data structures 320.

Figure 6:
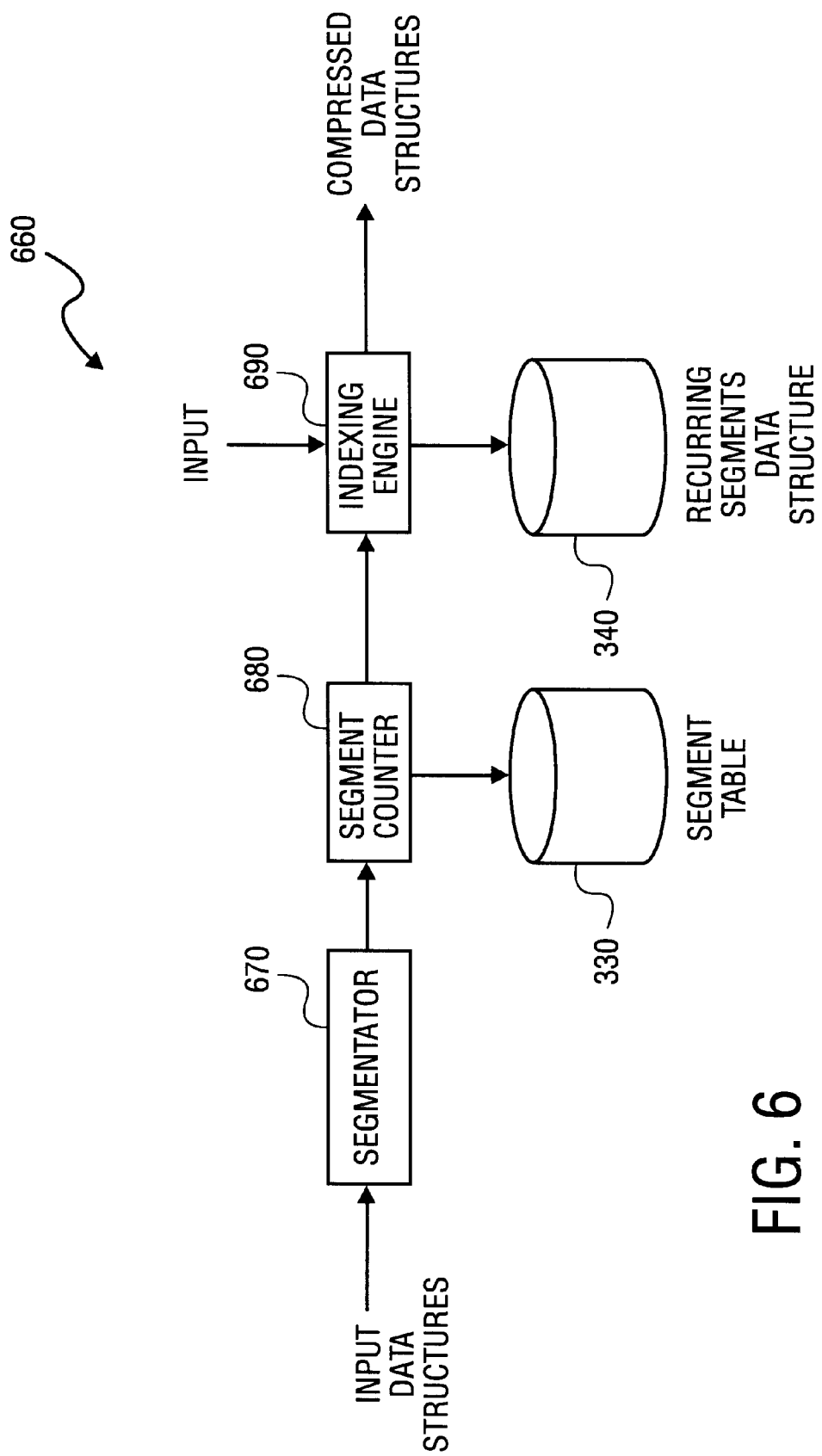
FIG. 6 is a block diagram illustrating one embodiment of a data structure compression system.

FIG. 6 is a block diagram illustrating one embodiment of a data structure compression system 660. Referring to FIG. 6, segmentator 670 receives uncompressed data structures from the input data structures 320. Segmentator 670 identifies segments within input data structures 320. The identified segments are passed to segment counter 680, which increments a count value in segment table 330. Indexing engine 690 reads input data structures 320 and determines whether any segment is recurring. Indexing engine 690 checks the count value for the segment within segment table 330. If the count value is greater than one (1), indexing engine 690 stores each recurring segment in recurring segments data structure 340 and stores the compressed data structures in compressed data structures 350.

Figure 7:
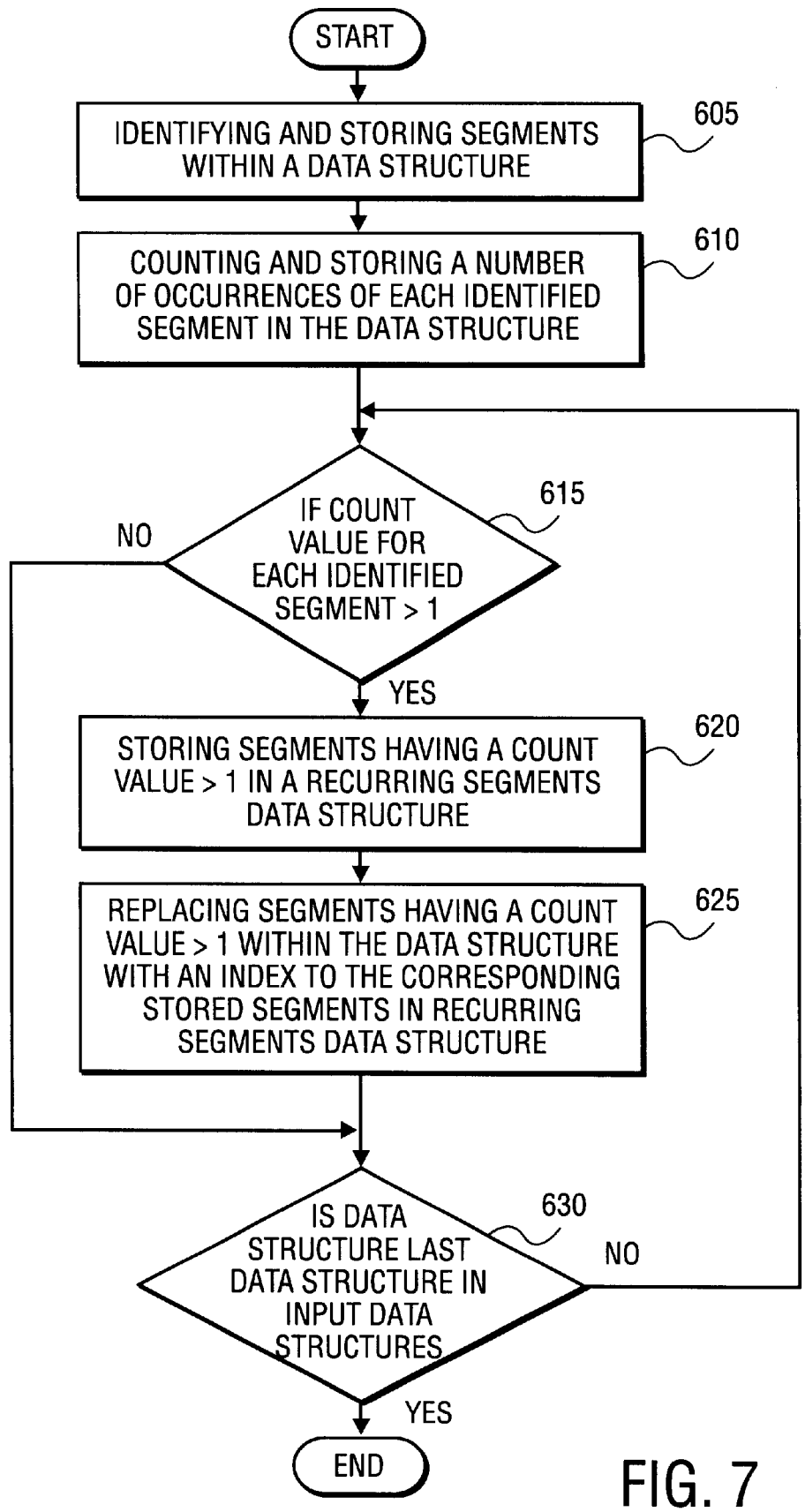
FIG. 7 is a flow diagram of one embodiment for compressing a data structure.

FIG. 7 is a flow diagram of one embodiment for compressing input data structure 320. Initially, at processing block 605, all segments within input data structure 320 are identified and stored as segments 408. In one embodiment, the segments 408 are textual representations (such as, for example, feature structures) within input data structure 320. The number of occurrences of each segment 408 are counted at processing block 610 and stored in count values 410.

After all segments 408 are identified and counted, at decision block 615, a determination is made if the count value for each segment is greater than 1. If count value 410 is greater than 1, processing continues at processing block 620. If count value 410 is greater than 1, segments 408 having a count value 410 greater than 1 are stored in recurring segments data structure 340 at processing block 620. In one embodiment, the compression process performs a first pass on all input data structures 320 before proceeding to processing block 625. In an alternate embodiment, only a single pass through input data structures 320 may be performed.

In one embodiment, at processing block 625, the compression process performs a second pass on segments 408, count values 410, indices 505, and recurring segments 508. At processing block 625, recurring segments 500 are replaced within input data structure 320 with an index 505 to the stored recurring segments 508 in the recurring segments data structure 340 in order create a compressed data structure. In one embodiment, index 508 is a numerical index referring to recurring segments 500. In alternate embodiments, any suitable indexing method may be used. The compressed structure is then stored as compressed data structures 350.

At processing block 630, a determination is made if input data structures 320 has been completely processed. If input data structures 320 is not completely processed, the compression process continues to decision block 615. If it input data structures 320 is completely processed, the compression process ends.

FIG. 8 is an exemplary uncompressed input data structure 320. Referring to FIG. 8, an uncompressed feature structure 810 is shown. In the example shown, uncompressed feature structure 810 is a linguistic data structure. The uncompressed feature structure 810 includes non-recurring segment 712 and recurring segment 814. In the example, segments 812 and 814 are textual representations.

FIG. 9 is an exemplary compressed data structure 350. Referring to FIG. 9, compressed feature structure 910 is shown. In the example shown, compressed feature structure 910 is a compressed linguistic data structure. The FIG. 9 feature structure 910 corresponds to the FIG. 8 feature structure after processing by the compression program 310. In the FIG. 8 example, recurring segment 814 in uncompressed feature structure 810 is replaced with numerical index 812 in compressed feature structure 910. In this example, numerical index 812 replaces a textual representation. Thus, by replacing a textual representation with a numerical index, less memory is required for storing and processing linguistic data structures. For example, a numerical index may be stored as one or two bytes of data whereas textual representations may be stored as several bytes of data.

Thus, a method and system for reducing the amount of memory used while allowing fast and random access to linguistic structures have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A computerized method for compressing a data structure, comprising:
   identifying at least one segment within the data structure, wherein the at least one segment is a discrete sub-structure of the data structure and comprises at least one feature-value pair; and
   if the number of occurrences of the at least one segment within the data structure is greater than one,
      saving the at least one segment in a recurring data structure, and
      replacing the at least one segment within the data structure with an index corresponding to the at least one segment in the recurring data structure.

2. The method of claim 1, wherein the data structure is a linguistic data structure.

3. The method of claim 1, wherein the at least one segment within the data structure is a textual representation.

4. The method of claim 1, wherein counting a number of occurrences includes storing the at least one segment and a count value corresponding to the number of occurrences of the at least one segment within the data structure in a table.

5. The method of claim 1, wherein identifying at least one segment includes finding a recurring textual representation within the data structure.

6. The method of claim 5, wherein replacing the at least one segment replaces the recurring textual representation with a numerical index.

7. The method of claim 6, wherein the index points to a location within the recurring data structure, the location being associated with the replaced textual representation.

8. The method of claim 7, wherein the index is stored in the recurring data structure.

9. A computerized system for compressing a data structure, comprising:
   a segmentator configured to determine at least one segment within the data structure, wherein the at least one segment is a discrete sub-structure of the data structure and comprises at least one feature-value pair;
   a segment counter configured to count a number of occurrences of the at least one segment within the data structure; and
   a recurring data structure for storing the at least one segment if the number of occurrences of the at least one segment is greater than one, wherein the at least one segment in the data structure is replaced by an index corresponding to the at least one segment in the recurring data structure.

10. The system of claim 9, wherein the data structure is a linguistic data structure.

11. The system of claim 9, wherein the at least one segment within the data structure is a textual representation.

12. The system of claim 9, wherein the segment counter is also configured to store the at least one segment and a count value representing the number of occurrences of the at least one segment within the data structure in a table.

13. The system of claim 12, further comprising:
   an indexing engine configured to store the at least one segment if the count value of the at least one segment is greater than one in the recurring data structure and replacing the at least one segment in the data structure with the index corresponding to the at least one segment in the recurring data structure.

14. The system of claim 9, wherein the segmentator is also configured to find a recurring textual representation within the data structure.

15. The system of claim 14, wherein the recurring textual representation within the data structure is replaced by the numerical index.

16. The system of claim 9, wherein the index is stored in the recurring data structure.

17. An article of manufacture including one or more computer-readable media with executable instructions therein, which, when executed by a processing device causes the processing device to:
   identify at least one segment within the data structure, wherein the at least one segment is a discrete sub-structure of the data structure and comprises at least one feature-value pair;
   count a number of occurrences of the at least one segment within the data structure;
   save the at least one segment in a recurring data structure if the number of occurrences is greater than one; and
   replace the at least one segment within the data structure with an index corresponding to the at least one segment in the recurring data structure.

18. The article of manufacture of claim 17, wherein identify at least one segment includes to find a recurring textual representation within the data structure.

19. The article of manufacture of claim 17, wherein replace the at least one segment within the data structure includes to replace the recurring textual representation within the data structure by a numerical index.

20. The article of manufacture of claim 17, wherein the index is stored in the recurring data structure.

21. An apparatus for compressing a data structure comprising:

means for identifying at least one segment within the data structure, wherein the at least one segment is a discrete sub-structure of the data structure and comprises at least one feature-value pair;

means for counting a number of occurrences of the at least one segment within the data structure; and a recurring data structure for storing the at least one segment if the number of occurrences of the at least one segment is greater than one, wherein the at least one segment in the data structure is replaced by an index corresponding to the at least one segment in the recurring data structure.

22. The apparatus of claim 21, wherein the data structure is a linguistic data structure.

23. The apparatus of claim 21, wherein the at least one segment within the data structure is a textual representation.

24. The apparatus of claim 21, wherein the means for counting further stores a count value representing the number of occurrences of the at least one segment in a table.

25. The apparatus of claim 24, further comprising:

a means for indexing to store the at least one segment in the recurring data structure if the count value of the at least one segment is greater than one, and further for replacing the at least one segment in the data structure with the index corresponding to the at least one segment in the recurring data structure.

26. The apparatus of claim 21, wherein the means for identifying is further operable to find a recurring textual representation within the data structure.

27. The apparatus of claim 26, wherein the recurring textual representation within the data structure is replaced by the numerical index.

28. The apparatus of claim 21, wherein the index is stored in the recurring data structure.

* * * * *